US010509279B2

(12) United States Patent
Shi et al.

(10) Patent No.: US 10,509,279 B2
(45) Date of Patent: Dec. 17, 2019

(54) THIN FILM TRANSISTOR, TFT SUBSTRATE, AND DISPLAY PANEL HAVING SOURCE ELETRODES AND GATE ELECTRODES COMPRISING U-SHAPE STRUCTURES

(71) Applicant: Shenzhen China Star Optoelectronics Semiconductor Display Technology Co., Ltd., Shenzhen, Guangdong (CN)

(72) Inventors: Longqiang Shi, Guangdong (CN); Shu-Jhih Chen, Guangdong (CN)

(73) Assignee: Shenzhen China Star Optoelectronics Semiconductor Display Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 15/568,873

(22) PCT Filed: Jun. 22, 2017

(86) PCT No.: PCT/CN2017/089460
§ 371 (c)(1),
(2) Date: Oct. 24, 2017

(87) PCT Pub. No.: WO2018/223427
PCT Pub. Date: Dec. 13, 2018

(65) Prior Publication Data
US 2018/0356669 A1 Dec. 13, 2018

(30) Foreign Application Priority Data
Jun. 7, 2017 (CN) .......................... 2017 1 0423982

(51) Int. Cl.
*G02F 1/1345* (2006.01)
*H01L 27/12* (2006.01)
(Continued)

(52) U.S. Cl.
CPC ........ *G02F 1/13454* (2013.01); *G02F 1/1368* (2013.01); *H01L 27/1225* (2013.01);
(Continued)

(58) Field of Classification Search
CPC combination set(s) only.
See application file for complete search history.

(56) References Cited

U.S. PATENT DOCUMENTS 5,910,677 A * 6/1999 Irino .................... H01L 27/0277
257/393
2006/0146218 A1* 7/2006 Her ....................... G02F 1/1368
349/43
(Continued)

FOREIGN PATENT DOCUMENTS

CN 202142535 U 2/2012
CN 104485361 A 4/2015
(Continued)

*Primary Examiner* — Lauren Nguyen
(74) *Attorney, Agent, or Firm* — Andrew C. Cheng (57) ABSTRACT

A thin film transistor, a TFT substrate, and a display panel are provided. The TFT includes a gate, a source, and a drain. The source is a first bending structure. The drain is a second bending structure. The gate is a third bending structure. The first bending structure of the source and the second bending structure of the drain are arranged opposite. The third bending structure of the gate is arranged between the first bending structure of the source and the second bending structure of the drain. The present disclosure facilitates fabrication of a narrow bezel of a display panel.

3 Claims, 6 Drawing Sheets

(51) Int. Cl.
*H01L 29/786* (2006.01)
*H01L 29/417* (2006.01)
*G02F 1/1368* (2006.01)
*H01L 29/423* (2006.01)

(52) U.S. Cl.
CPC .. *H01L 29/41733* (2013.01); *H01L 29/42384* (2013.01); *H01L 29/7869* (2013.01); *G02F 2201/124* (2013.01); *G02F 2202/10* (2013.01)

(56) References Cited

U.S. PATENT DOCUMENTS

| | | |
|---|---|---|
| 2007/0090373 A1 | 4/2007 | Beach et al. |
| 2015/0311236 A1 | 10/2015 | Choi |

FOREIGN PATENT DOCUMENTS

| | | | | |
|---|---|---|---|---|
| CN | 105118865 A | 12/2015 | | |
| CN | 105140297 A | 12/2015 | | |
| CN | 205692837 U | 11/2016 | | |
| CN | 10-7204375 | * 5/2017 | ....... | H01L 29/78618 |
| CN | 107204375 A | 9/2017 | | |

\* cited by examiner

THIN FILM TRANSISTOR, TFT SUBSTRATE, AND DISPLAY PANEL HAVING SOURCE ELETRODES AND GATE ELECTRODES COMPRISING U-SHAPE STRUCTURES

BACKGROUND

1. Field of the Disclosure

The present disclosure relates to the field of display, and more particularly, to a thin film transistor (TFT), a TFT substrate, and a display panel.

2. Description of Related Art

A gate driver on array (GOA) is a shift register formed by a plurality of thin film transistors (TFTs). The gate driver is fabricated on an array glass substrate so the space for gate driver bonding is spared, which is good for fabrication of a narrow bezel on a gate side.

Figure 1:
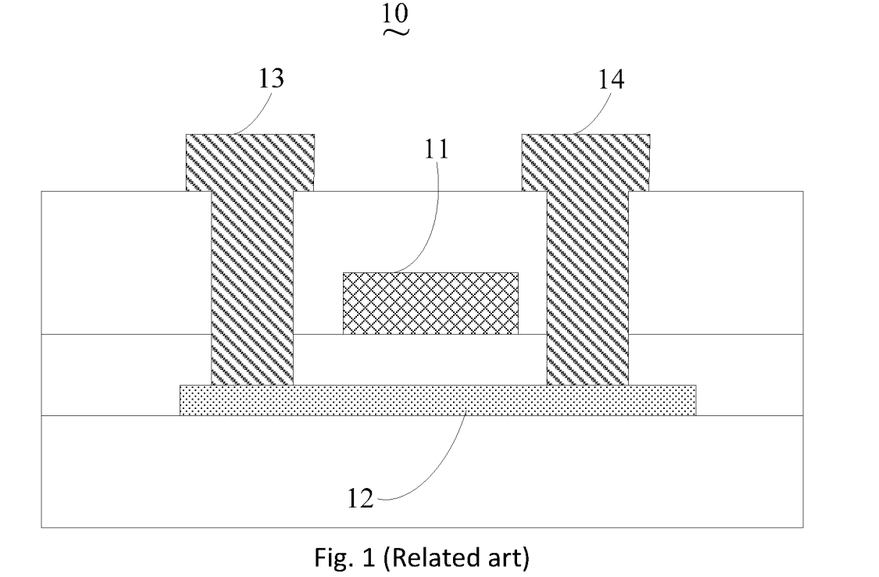
FIG. 1 illustrates a cross-sectional view of a conventional transistor.
Figure 2:
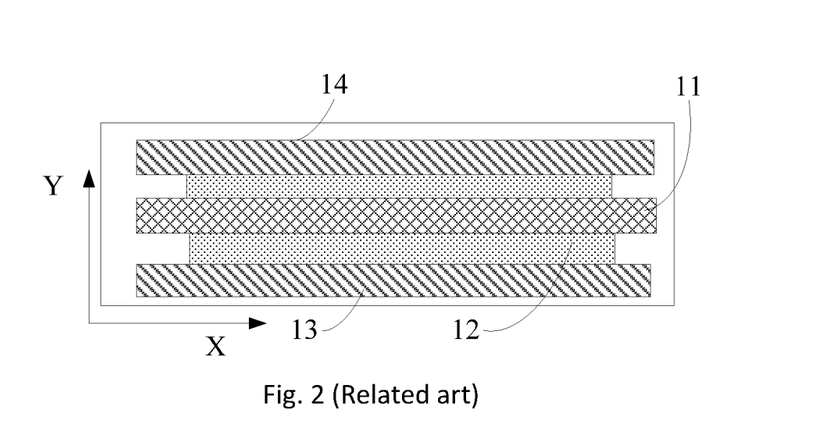
FIG. 2 illustrates a top view of a conventional transistor.

Please refer to FIG. 1 illustrating a cross-sectional view of a gate 11 arranged on a top gate indium gallium zinc oxide-TFT (top gate IGZO-TFT). The gate 11 of the TFT 10 is arranged is arranged on a semiconductor layer 12. A source 13 and a drain 14 are both electrically connected to the semiconductor layer 12. The TFT 10 has advantages of high mobility and small parasitic capacitance so a good waveform with small resistor-capacitor (RC) delay can be output, which is one of the current research hotspots. FIG. 2 is a bird's-eye view of the structure of a top gate IGZO-TFT of related art. The top gate IGZO-TFT of related art is an I-type structure. The length W of the TFT 10 of the top gate IGZO-TFT is extremely long in a X direction and takes large space of the X axis. Such a structure is disfavored when the gate side for the GOA is fabricated to be a narrow bezel.

SUMMARY

An object of the present disclosure is to provide a thin film transistor (TFT), a TFT substrate, and a display panel to facilitate fabrication of a narrow bezel of a display panel.

In one aspect of the present disclosure, a thin film transistor (TFT) comprises a gate, a source, and a drain. The source is a first bending structure. The drain is a second bending structure. The gate is a third bending structure. The first bending structure of the source and the second bending structure of the drain are arranged opposite. The third bending structure of the gate is arranged between the first bending structure of the source and the second bending structure of the drain.

In another aspect of the present disclosure, a thin film transistor (TFT) substrate includes a display area and a non-display area. A plurality of pixel units are arranged in a matrix in the display area. A gate driving circuit is configured to drive the plurality of driving pixel units arranged in the non-display area. The gate driving circuit includes a plurality of TFTs. The TFT comprises a gate, a source, and a drain. The source is a first bending structure. The drain is a second bending structure. The gate is a third bending structure. The first bending structure of the source and the second bending structure of the drain are arranged opposite. The third bending structure of the gate is arranged between the first bending structure of the source and the second bending structure of the drain. The sources and the drains of the TFTs in each row or in each column are connected in series correspondingly.

In still another aspect of the present disclosure, a display panel includes a thin film transistor (TFT) substrate, a color filter (CF) substrate, and a liquid crystal layer therebetween. The TFT substrate and the CF substrate are arranged opposite. The TFT substrate includes a display area and a non-display area. A plurality of pixel units are arranged in a matrix in the display area. A gate driving circuit is configured to drive the plurality of driving pixel units arranged in the non-display area. The gate driving circuit includes a plurality of TFTs. The TFT comprises a gate, a source, and a drain. The source is a first bending structure. The drain is a second bending structure. The gate is a third bending structure. The first bending structure of the source and the second bending structure of the drain are arranged opposite. The third bending structure of the gate is arranged between the first bending structure of the source and the second bending structure of the drain. The sources and the drains of the TFTs in each row or in each column are connected in series correspondingly.

The adoption of the present disclosure will bring some benefits. Compared with the related art, the present disclosure provides a TFT, a TFT substrate, and a display panel, and a gate, a source, and a drain of the TFT are bending structures, which reduces space occupied in a bending direction, thereby facilitating fabrication of a narrow bezel of a display panel in the present disclosure.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF THE EMBODIMENTS

The invention is described below in detail with reference to the accompanying drawings, wherein like reference numerals are used to identify like elements illustrated in one or more of the figures thereof, and in which exemplary embodiments of the invention are shown. This invention may, however, be embodied in many different forms and should not be construed as limited to the particular embodiments set forth herein. Rather, these embodiments are provided so that this disclosure will be thorough and complete, and will fully convey the scope of the invention to those skilled in the art. The drawings illustrate embodiments of the invention and, together with the description, serve to explain the principles of the invention.

Figure 3:
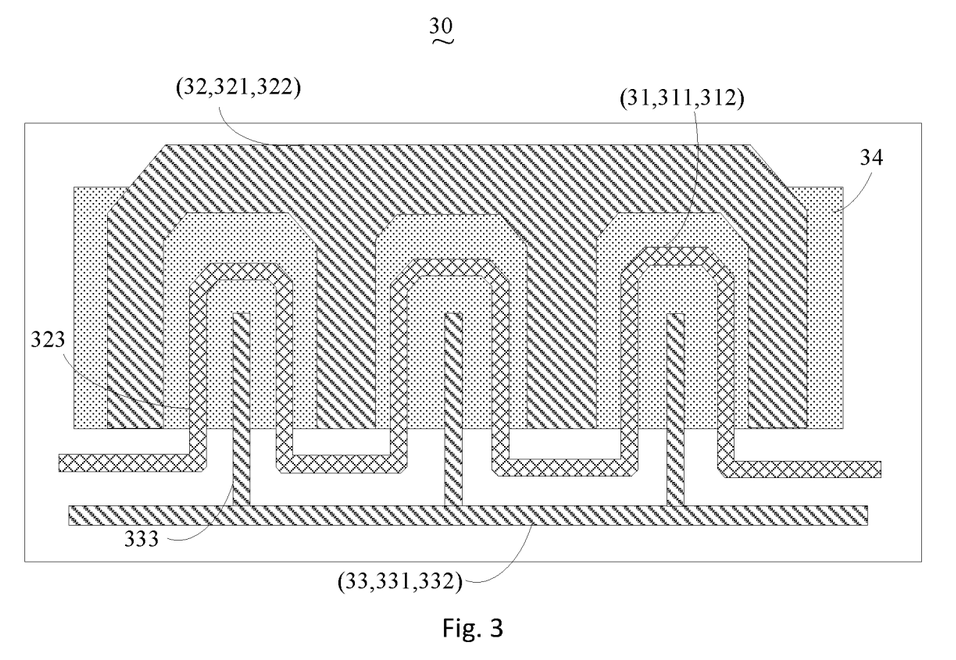
FIG. 3 illustrates a schematic diagram of the structure of a thin film transistor (TFT) according to a first embodiment of the present disclosure.

FIG. 3 illustrates a schematic diagram of the structure of a thin film transistor (TFT) 30 in an embodiment of the present disclosure. The TFT 30 includes a gate 31, a source 33, a drain 32, and a semiconductor layer 34. The source 33 is a first bending structure 331. The drain 32 is a second bending structure 321. The gate 31 is a third bending structure 311. The first bending structure 331 of the source 33 and the second bending structure 321 of the drain 32 are arranged opposite. Besides, the source 33 and the drain 32 are electrically connected to the semiconductor layer 34. The third bending structure 311 of the gate 31 is arranged between the first bending structure 331 of the source 33 and the second bending structure 321 of the drain 32. The first bending structure 331 and the second bending structure 321 are arranged and matched; that is, the first bending structure 331 and the second bending structure 321 are interwoven. One part of the first bending structure 331 is inserted into the second bending structure 321. One part of the second bending structure 321 is inserted into the first bending structure 331. Moreover, the first bending structure 331 is not connected to the second bending structure 321, and further, some space between the first bending structure 331 and the second bending structure 321 is spared for the arrangement of the third bending structure 311. Because the gate 31, the source 33, and the drain 32 are all bending structures, the space for an extending direction vertical to the bending structures is reduced in the TFT 30.

In the present embodiment, the first bending structure 331 is a structure including one or more U-shaped structure or one or more T-shaped structure. The second bending structure 321 is a structure including one or more U-shaped structure or one or more T-shaped structure. The third bending structure 311 is a structure including one or more waveform structure. The waveform is a periodic waveform, and the waveform of the former half period is opposite to the waveform of the latter half period. The periodic waveform may be shaped like square, sinusoid, triangle, and so on. The shape of the first bending structure 331 is square in the present embodiment.

The first bending structure 331 is formed by N U-shaped structures connected with one another, while the second bending structure 321 is formed by N T-shaped structures connected with one another; or the first bending structure 331 is formed by N T-shaped structures connected with one another, while the second bending structure 321 is formed by N N-shaped structures connected with one another. The third bending structure 311 is a structure including N waveform structures. The N is an integer which is greater than or equal to one.

As FIG. 3 illustrates, the N is equal to three. Specifically, the first bending structure 331 is a structure including three T-shaped structures 332 connected with one another. The second bending structure 321 is a structure including three U-shaped structures 322 connected with one another. The third bending structure 311 is a structure including three square waves 312.

An opening 323 of the U-shaped structure 322 is arranged on the T-shaped structure 332 correspondingly, and a extending portion 333 of the T-shaped structure 332 is inserted into the opening 323 of the U-shaped structure 322. The square wave 312 is bended between the U-shaped structure 322 and the T-shaped structure 332. Further, the space for an extending direction vertical to the bending structure is reduced.

Figure 4:
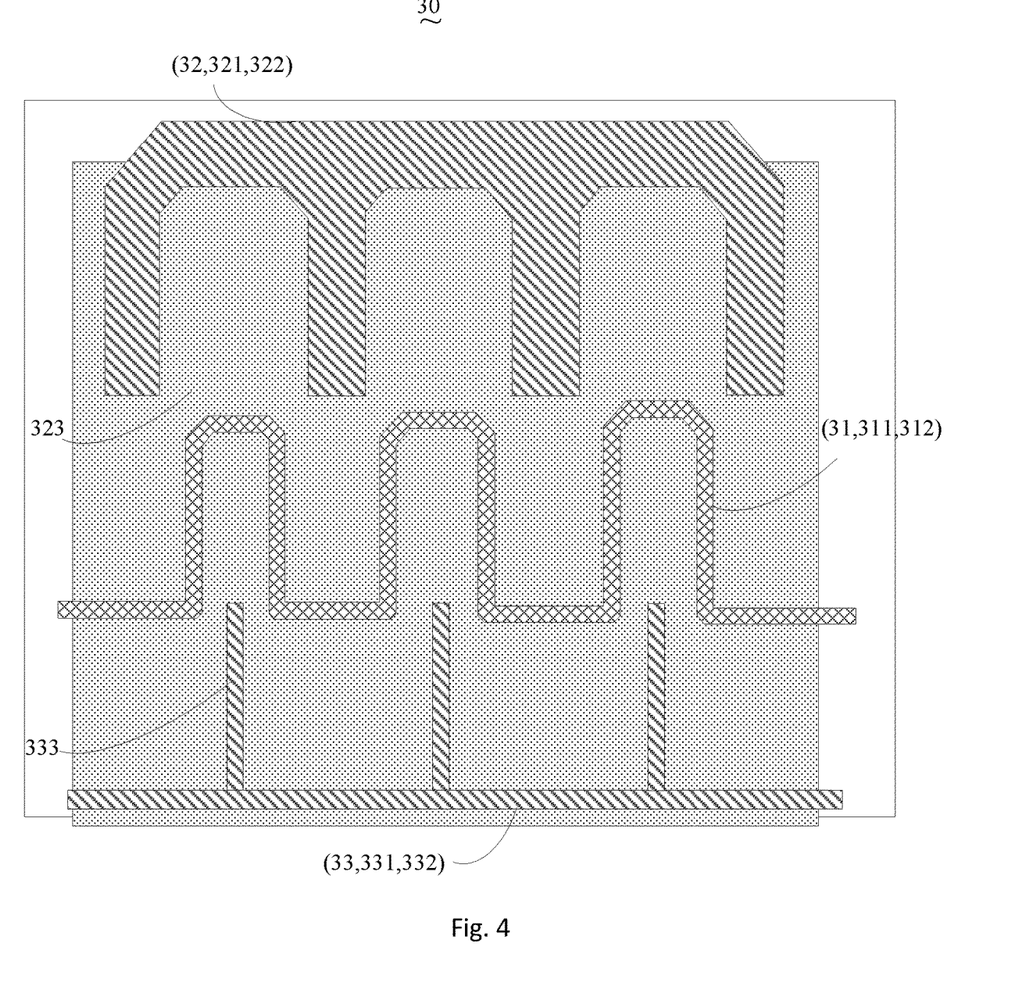
FIG. 4 illustrates a schematic diagram of the structure of a thin film transistor (TFT) according to a second embodiment of the present disclosure.

To loosen the difficulty of fabrication, the extending portion 333 of the T-shaped structure 332 is merely arranged on the opening 323 of the U-shaped structure 322 or a location at a predetermined distance from the opening 323 of the U-shaped structure 322. The square wave 312 is bended between the opening 323 of the U-shaped structure 322 and the extending portion 333 of the T-shaped structure 332, as FIG. 4 illustrates.

The first bending structure 331 may further be a structure including N U-shaped structures connected with one another. The second bending structure 321 may further be a structure including N T-shaped structures connected with one another. The third bending structure 311 may further be a structure including N waveform structures.

Figure 5:
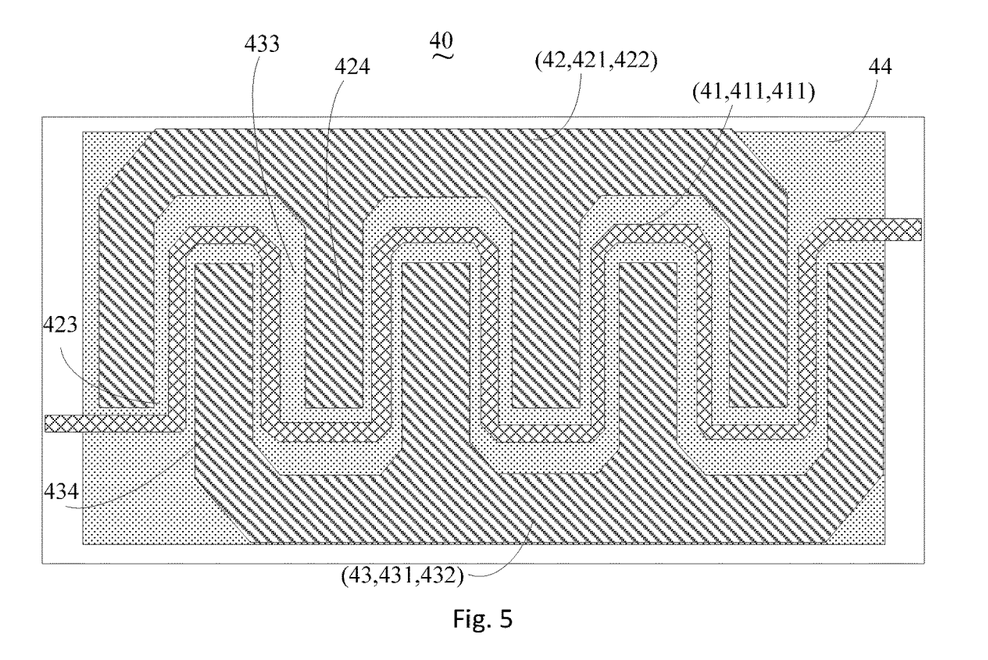
FIG. 5 illustrates a schematic diagram of the structure of a thin film transistor (TFT) according to a third embodiment of the present disclosure.

FIG. 5 illustrates a schematic diagram of a thin film transistor (TFT) 40 in another embodiment of the present disclosure. The TFT 40 still includes a gate 41, a source 43, a drain 42, and a semiconductor layer 44. The gate 41, the source 43, and the drain 42 are a third bending structure 441, a first bending structure 431, and a second bending structure 421 correspondingly. The source 43 and the drain 42 are electrically connected to the semiconductor layer 44.

Differing from the TFT 30 introduced above, in the TFT 40 a first bending structure 431 is a structure including N U-shaped structures 432 connected with one another. The second bending structure 421 is a structure including N U-shaped structures 422 connected with one another. The third bending structure 411 is a structure including N square waves 412. The N is an integer which is greater than or equal to one. The N is three in the present embodiment.

An opening 433 of the U-shaped structure 432 of the first bending structure 431 and an opening 423 of the U-shaped structure 422 of the second bending structure 421 are arranged face to face. Besides, the U-shaped structure 432 of the first bending structure 431 and the U-shaped structure 422 of the second bending structure 421 are staggered so that the lateral wall 434 of the U-shaped structure 432 and the lateral wall 424 of the U-shaped structure 422 can be inserted into the openings of each other. The square wave 412 is bended between the U-shaped structure 432 of the first bending structure 431 and the U-shaped structure 422 of the second bending structure 421.

To loosen the difficulty of fabrication, the structure provided by the present embodiment is similar to the structure introduced above. The lateral wall 434 of the U-shaped structure 432 is merely arranged on an opening 423 of the U-shaped structure 422 or a location at a predetermined distance from the opening 423 of the U-shaped structure 422. The square wave 412 is bended between the lateral wall 424 of the U-shaped structure 422 and the lateral wall 434 of the U-shaped structure 432.

To reduce the use of material, an N−1-U-shaped-structure-connected structure may be further arranged between the first bending structure 431 and the second bending structure 432. The N is an integer which is greater than or equal to two.

Figure 6:
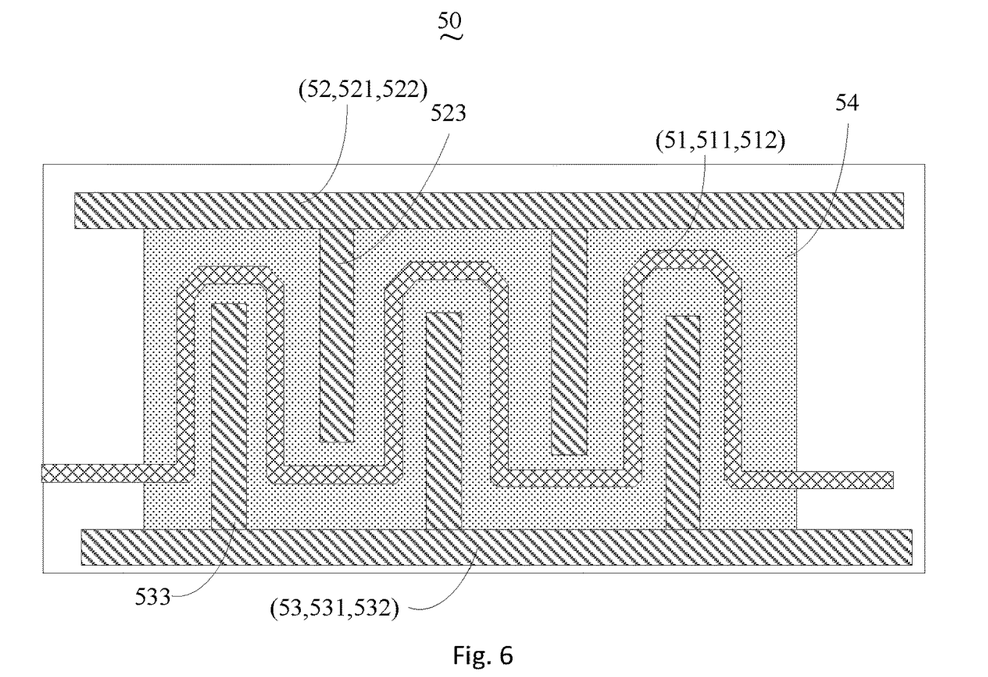
FIG. 6 illustrates a schematic diagram of the structure of a thin film transistor (TFT) according to a fourth embodiment of the present disclosure.

FIG. 6 illustrates a schematic diagram of the structure of a thin film transistor (TFT) 50 in another embodiment of the present disclosure. The TFT 50 still includes a gate 51, a source 53, a drain 52, and a semiconductor layer 54. Moreover, the gate 51, the source 53, and the drain 52 are still a third bending structure 511, a first bending structure 531, and a second bending structure 521 correspondingly. The source 53 and the drain 52 are electrically connected to the semiconductor layer 54.

Differing from the TFT 30 introduced above, in the TFT 50 the first bending structure 531 is a structure including N T-shaped structures 532 connected with one another. The second bending structure 521 is a structure including N−1 T-shaped structures 522 connected with one another. The third bending structure 511 is a structure including N square waves 512. The N is an integer which is greater than or equal to two. The N is three in the present embodiment.

The extending portions 533 and 523 of the T-shaped structure 532 of the first bending structure 531 and the T-shaped structures 522 of the second bending structure 521 are arranged face to face and staggered. The square wave 512 is bended between the T-shaped structure 532 and the T-shaped structures 522.

The extending portion 523 of the T-shaped structure 522 and the extending portion 533 of the T-shaped structure 523 are inserted into the two extending portions of their counterpart correspondingly. In another embodiment, a extending portion 523 of a T-shaped structure 522 is not inserted into a extending portion 533 of a T-shaped structure 523 and vice versa.

In another embodiment, a first bending structure 531 is a structure including N T-shaped structures 532 connected with one another, and the second bending structure 521 is a structure including N T-shaped structures 522 connected with one another.

Figure 7:
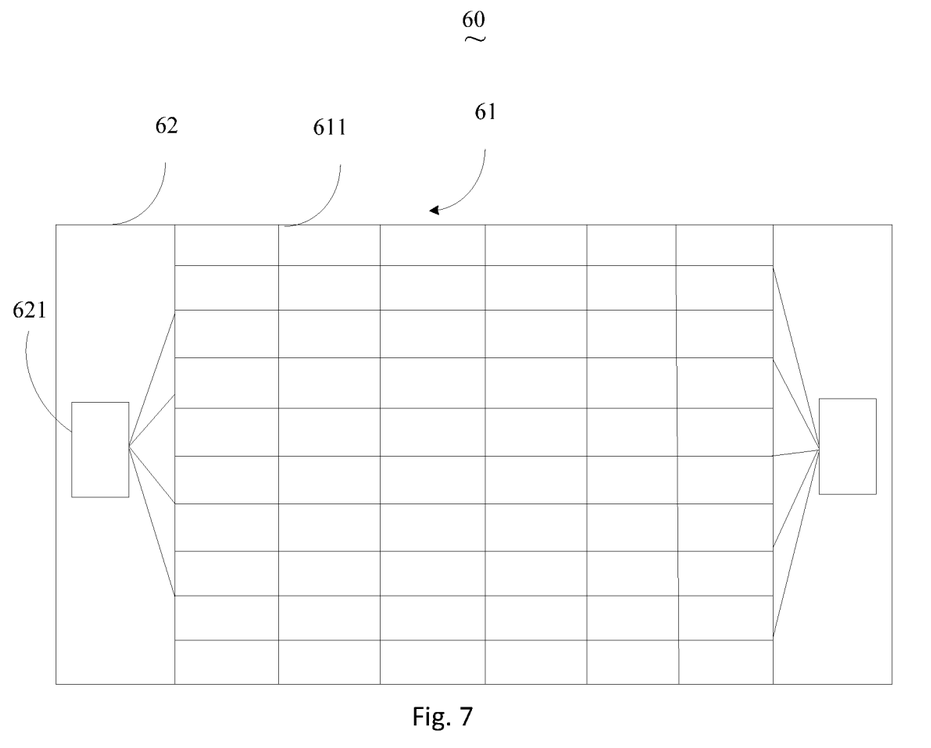
FIG. 7 illustrates a schematic diagram of an array substrate according to an embodiment of the present disclosure.
Figure 8:
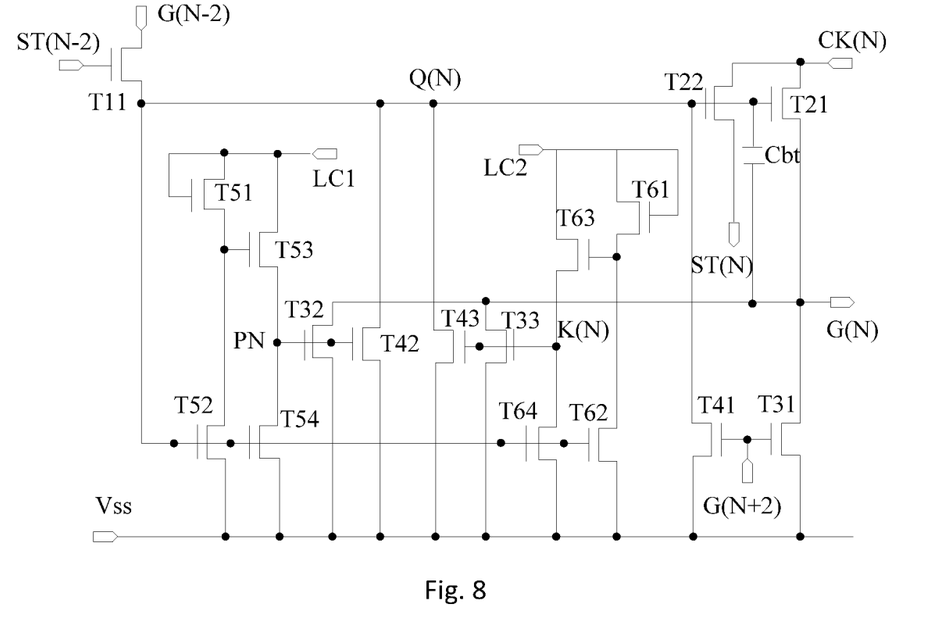
FIG. 8 illustrates a circuit diagram of a gate driving circuit used in the array substrate shown in FIG. 7.

The present embodiment further provides a thin film transistor (TFT) substrate 60. Please refer to FIG. 7. The TFT substrate 60 includes a display area 61 and a non-display area 62. A plurality of pixel units 611 are arranged in a matrix in the display area 61. A gate driving circuit 621 of a driving pixel unit is arranged in the non-display area 62. The driving pixel unit 621 is arranged on the TFT substrate 60 with a gate driver on array (GOA) technique, and the gate driving circuit 621 is a shift register formed by a plurality of TFTs, as FIG. 8 illustrates. The TFT is the TFT introduced above so the present disclosure will not go into detail.

The source and the drain of the TFT in each row or in each column are connected in series correspondingly in the present embodiment. Compared with the related art, the distance between the source and the drain in the bending direction is shortened in the present disclosure, which is beneficial to fabrication of the narrow bezel of the display panel.

Figure 9:
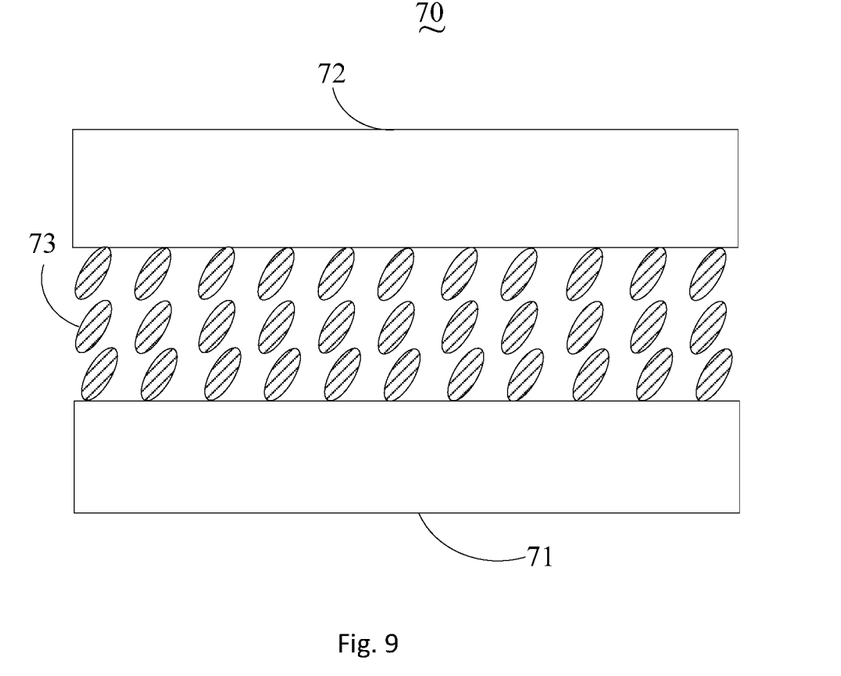
FIG. 9 illustrates a schematic diagram of a display panel according to an embodiment of the present disclosure.

Please refer to FIG. 9. The present disclosure further provides a display panel 70. The display panel 70 includes a TFT substrate 71, a color filter (CF) substrate 72, and a liquid crystal layer 73. The TFT substrate 71 and the CF substrate 72 are arranged opposite. The liquid crystal layer 73 is arranged between the TFT substrate 71 and the CF substrate 72. The TFT substrate 71 is the TFT substrate 60 introduced above so the present disclosure will not go into detail.

In conclusion, the present disclosure provides a TFT. The gate, the source, and the drain of the TFT are bending structures, which reduces space occupied in a bending direction, thereby facilitating fabrication of a narrow bezel of a display panel in the present disclosure.

The present disclosure is described in detail in accordance with the above contents with the specific preferred examples. However, this present disclosure is not limited to the specific examples. For the ordinary technical personnel of the technical field of the present disclosure, on the premise of keeping the conception of the present disclosure, the technical personnel can also make simple deductions or replacements, and all of which should be considered to belong to the protection scope of the present disclosure.

What is claimed is:

1. A thin film transistor (TFT), comprising a gate, a source, and a drain; the source being a first bending structure; the drain being a second bending structure; the gate being a third bending structure wherein the first bending structure of the source and the second bending structure of the drain are arranged opposite; the third bending structure of the gate is arranged between the first bending structure of the source and the second bending structure of the drain; wherein the first bending structure is a structure comprising one or more U-shaped structure or one or more T-shaped structure; the second bending structure is a structure comprising one or more U-shaped structure or one or more T-shaped structure; the thin film transistor further comprises a semiconductor layer, the gate, the source and the drain are arranged at a same side of the semiconductor layer, a vertical projection of the gate projected on a plane of the semiconductor layer is not overlapped by a vertical projection of the source projected on the plane of the semiconductor layer wherein the third bending structure is a structure comprising one or more waveform structure; the waveform is a periodic waveform, and the waveform of a former half period is opposite to the waveform of a latter half period; wherein the first bending structure is a structure comprising either N U-shaped structures connected with one another or either N T-shaped structures connected with one another; the second bending structure is a structure comprising either N U-shaped structures connected with one another or either N T-shaped structures connected with one another, but the second bending structure is different from the first bending structure; the third bending structure is a structure comprising N waveform structures; the N is an integer which is greater than or equal to one; an opening of the U-shaped structure is arranged on the T-shaped structure; a extending portion of the T-shaped structure is inserted into the opening of the U-shaped structure; the waveform structure is bended between the U-shaped structure and the T-shaped structure; wherein the first bending structure is a structure comprising N T-shaped structures connected with one another, the second bending structure is a structure comprising N U-shaped structures connected with one another, wherein a width of an opening of each U-shaped structure is greater than a width of an opening of a peak of each waveform structure such that each peak is inserted into the opening of a corresponding U-shaped structure, and an extending portion of a T-shaped structure is inserted into an opening of a peak of a corresponding waveform structure.

2. A thin film transistor (TFT) substrate, comprising a display area and a non-display area, a plurality of pixel units being arranged in a matrix in the display area, a gate driving circuit configured to drive the plurality of driving pixel units being arranged in the non-display area, the gate driving circuit comprising a plurality of TFTs, wherein the TFT comprises a gate, a source, and a drain; the source is a first bending structure; the drain is a second bending structure; the gate is a third bending structure; the first bending structure of the source and the second bending structure of the drain are arranged opposite; the third bending structure of the gate is arranged between the first bending structure of the source and the second bending structure of the drain;

the first bending structure is a structure comprising one or more U-shaped structure or one or more T-shaped structure; the second bending structure is a structure comprising one or more U-shaped structure or one or more T-shaped structure;

the sources and the drains of the TFTs in each row or in each column are connected in series correspondingly;

the thin film transistor further comprises a semiconductor layer, the gate, the source and the drain are arranged at a same side of the semiconductor layer, a vertical projection of the gate projected on a plane of the semiconductor layer is not overlapped by a vertical projection of the source projected on the plane of the semiconductor layer wherein the third bending structure is a structure comprising one or more waveform structure; the waveform is a periodic waveform, and the waveform of a former half period is opposite to the waveform of a latter half period; wherein the first bending structure is a structure comprising either N U-shaped structures connected with one another or either N T-shaped structures connected with one another; the second bending structure is a structure comprising either N U-shaped structures connected with one another or either N T-shaped structures connected with one another, but the second bending structure is different from the first bending structure; the third bending structure is a structure comprising N waveform structures; the N is an integer which is greater than or equal to one; an opening of the U-shaped structure is arranged on the T-shaped structure; a extending portion of the T-shaped structure is inserted into the opening of the U-shaped structure; the waveform structure is bended between the U-shaped structure and the T-shaped structure; wherein the first bending structure is a structure comprising N T-shaped structures connected with one another, the second bending structure is a structure comprising N U-shaped structures connected with one another, wherein a width of an opening of each U-shaped structure is greater than a width of an opening of a peak of each waveform structure such that each peak is inserted into the opening of a corresponding U-shaped structure, and an extending portion of a T-shaped structure is inserted into an opening of a peak of a corresponding waveform structure.

3. A display panel, comprising a thin film transistor (TFT) substrate, a color filter (CF) substrate, and a liquid crystal layer therebetween; the TFT substrate and the CF substrate being arranged opposite, wherein the TFT substrate comprises a display area and a non-display area; a plurality of pixel units is arranged in a matrix in the display area; a gate driving circuit configured to drive the plurality of driving pixel units is arranged in the non-display area; the gate driving circuit comprises a plurality of TFTs, wherein the TFT comprises a gate, a source, and a drain; the source is a first bending structure; the drain is a second bending structure; the gate is a third bending structure; the first bending structure of the source and the second bending structure of the drain are arranged opposite; the third bending structure of the gate is arranged between the first bending structure of the source and the second bending structure of the drain;

the first bending structure is a structure comprising one or more U-shaped structure or one or more T-shaped structure; the second bending structure is a structure comprising one or more U-shaped structure or one or more T-shaped structure;

the sources and the drains of the TFT in each row or in each column are connected in series correspondingly;

the thin film transistor further comprises a semiconductor layer, the gate, the source and the drain are arranged at a same side of the semiconductor layer, a vertical projection of the gate projected on a plane of the semiconductor layer is not overlapped by a vertical projection of the source projected on the plane of the semiconductor layer wherein the third bending structure is a structure comprising one or more waveform structure; the waveform is a periodic waveform, and the waveform of a former half period is opposite to the waveform of a latter half period; wherein the first bending structure is a structure comprising either N U-shaped structures connected with one another or either N T-shaped structures connected with one another; the second bending structure is a structure comprising either N U-shaped structures connected with one another or either N T-shaped structures connected with one another, but the second bending structure is different from the first bending structure; the third bending structure is a structure comprising N waveform structures; the N is an integer which is greater than or equal to one; an opening of the U-shaped structure is arranged on the T-shaped structure; a extending portion of the T-shaped structure is inserted into the opening of the U-shaped structure; the waveform structure is bended between the U-shaped structure and the T-shaped structure; wherein the first bending structure is a structure comprising N T-shaped structures connected with one another, the second bending structure is a structure comprising N U-shaped structures connected with one another, wherein a width of an opening of each U-shaped structure is greater than a width of an opening of a peak of each waveform structure such that each peak is inserted into the opening of a corresponding U-shaped structure, and an extending portion of a T-shaped structure is inserted into an opening of a peak of a corresponding waveform structure.

* * * * *